(12) United States Patent
Attaran et al.

(10) Patent No.: US 12,362,473 B2
(45) Date of Patent: Jul. 15, 2025

(54) VEHICLE COMMUNICATION DEVICE INCLUDING AN ISOLATION CIRCUIT FOR ISOLATING SIGNALS FROM DIFFERENT ANTENNAS

(71) Applicant: FORD GLOBAL TECHNOLOGIES, LLC, Dearborn, MI (US)

(72) Inventors: Ali Attaran, Lasalle (CA); Jalal Jawany, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 280 days.

(21) Appl. No.: 18/303,938

(22) Filed: Apr. 20, 2023

(65) Prior Publication Data

US 2024/0356210 A1 Oct. 24, 2024

(51) Int. Cl.
| | |
|---|---|
| *H01Q 1/52* | (2006.01) |
| *H01Q 1/22* | (2006.01) |
| *H01Q 1/32* | (2006.01) |
| *H01Q 5/25* | (2015.01) |
| *H01Q 15/00* | (2006.01) |

(Continued)

(52) U.S. Cl.
CPC ............ *H01Q 1/521* (2013.01); *H01Q 1/2291* (2013.01); *H01Q 1/32* (2013.01); *H01Q 5/25* (2015.01); *H01Q 15/006* (2013.01); *H01Q 21/28* (2013.01); *H05K 1/0236* (2013.01)

(58) Field of Classification Search
CPC ...... H01Q 1/2291; H01Q 1/32; H01Q 1/3233; H01Q 1/3241; H01Q 1/52; H01Q 1/521; H01Q 1/523; H01Q 1/525; H01Q 5/25; H01Q 15/0006; H01Q 15/0013; H01Q 15/0053; H01Q 15/006; H01Q 15/0066; H01Q 15/0073; H01Q 15/008; H01Q 15/0086; H01Q 15/0093; H01Q 21/28;

(Continued)

(56) References Cited

U.S. PATENT DOCUMENTS

| | | | |
|---|---|---|---|
| 11,323,155 B2 | 5/2022 | Attaran et al. | |
| 2003/0193437 A1* | 10/2003 | Kangasvieri | H01Q 9/0421 343/702 |

(Continued)

OTHER PUBLICATIONS

Mridula P., et al., "Enhancing isolation in a two element array using an array of spiral resonators," Conference: 2020 Fourth World Conference on Smart Trends in Systems, Security and Sustainability (WordS4), Jul. 2020, pp. 76-80.

(Continued)

*Primary Examiner* — Robert Karacsony
(74) *Attorney, Agent, or Firm* — Joseph Zane; Brooks Kushman, P.C.

(57) ABSTRACT

A vehicle communication device includes a first antenna, a second antenna, and an isolation circuit. The first antenna is configured to emit and detect a first signal and the second antenna is configured to emit and detect a second signal. The isolation circuit is configured to isolate the first signal and the second signal from each other. The isolation circuit includes at least one resonator arranged between the first antenna and the second antenna. The first antenna and the resonator are separated by a first distance along a first axis, and the second antenna and the resonator are separated by a second distance along the first axis, where the first distance is shorter than the second distance.

18 Claims, 3 Drawing Sheets

(51) Int. Cl.
*H01Q 21/28* (2006.01)
*H05K 1/02* (2006.01)

(58) Field of Classification Search
CPC .... H05K 1/0216; H05K 1/0236; H01P 7/005; H01P 7/08; H01P 7/082
See application file for complete search history.

(56) References Cited

U.S. PATENT DOCUMENTS

| | | | |
|---|---|---|---|
| 2014/0152523 A1* | 6/2014 | Wu | H01Q 1/523 343/841 |
| 2015/0364817 A1* | 12/2015 | Ma | H01Q 1/243 343/810 |
| 2017/0170555 A1* | 6/2017 | Van Gils | H01Q 9/0407 |
| 2022/0294107 A1 | 9/2022 | Koul et al. | |

OTHER PUBLICATIONS

Rajalakshmi, P. and Gunavathi, N., "Compact Modified Hexagonal Spiral Resonator-Based Tri-Band Patch Antenna with Octagonal Slot for Wi-Fi/WLAN Applications," Progress In Electromagnetics Research C, vol. 106, 2020, pp. 77-87.

* cited by examiner

VEHICLE COMMUNICATION DEVICE INCLUDING AN ISOLATION CIRCUIT FOR ISOLATING SIGNALS FROM DIFFERENT ANTENNAS

TECHNICAL FIELD

The present disclosure relates to a vehicle communication device having multiple antennas for supporting different wireless communication protocols.

BACKGROUND

The statements in this section merely provide background information related to the present disclosure and may not constitute prior art.

Vehicles are generally configured to support wireless communication with external components, such as mobile phones and/or infrastructure devices. More particularly, one or more systems within the vehicle may exchange data with external devices using different wireless communication protocols. For example, a vehicle activation system may communicate with a selected device using a short-frequency range communication protocol (e.g., BLUETOOTH) and/or an ultrawide band communication protocol, which may require the system to include multiple antennas for emitting and/or detecting signals.

SUMMARY

This section provides a general summary of the disclosure and is not a comprehensive disclosure of its full scope or all of its features.

In one form, the present disclosure is directed to a vehicle communication device that includes a first antenna, a second antenna, and an isolation circuit. The first antenna is configured to operate, in accordance with a first wireless communication protocol, to emit and detect at least one first signal. The second antenna is configured to operate, in accordance with a second wireless communication protocol different from the first wireless communication protocol, to emit and detect at least one second signal. The isolation circuit is configured to isolate the at least one first signal and the at least one second signal from each other. The isolation circuit includes at least one resonator, arranged between the first antenna and the second antenna with respect to a two-dimensional plane. The first antenna and the at least one resonator are separated by a first distance along a first axis of the two-dimensional plane, the second antenna and the at least one resonator are separated by a second distance along the first axis of the two-dimensional plane, and the first distance is shorter than the second distance.

In one form, the present disclosure is directed to a vehicle communication device that includes a first antenna, an ultra-wideband (UWB) antenna, an isolation circuit, and a processor board. The first antenna is configured to emit and detect at least one first signal. The UWB antenna, as a second antenna, is configured to emit and detect at least one second signal. The isolation circuit is configured to isolate the at least one first signal and the at least one second signal from each other. The isolation circuit includes at least one resonator arranged between the first antenna and the second antenna. The processor board includes a first signal processor and a second signal processor. The first signal processor is electrically coupled to the first antenna and is configured to process the at least one first signal to be emitted or to be detected via the first antenna. The second signal processor is electrically coupled to the second antenna and is configured to process the at least one second signal to be emitted or to be detected via the second antenna. A first distance is defined between the first antenna and the at least one resonator. A second distance is defined between the second antenna and the at least one resonator, and the first distance is shorter than the second distance.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

In order that the disclosure may be well understood, there will now be described various forms thereof, given by way of example, reference being made to the accompanying drawings, in which.

Figure 1:
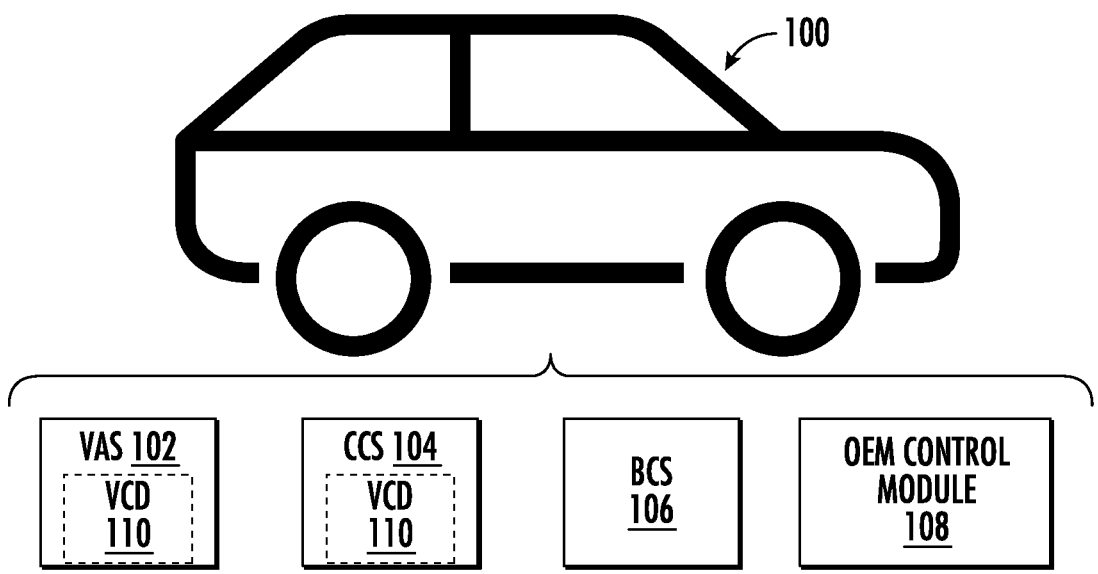
FIG. 1 illustrates a vehicle having a vehicle communication device in accordance with the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. The figures are not necessarily to scale; some features may be exaggerated or minimized to show details of particular components. Therefore, specific structural and functional details disclosed herein are not to be interpreted as limiting.

Vehicle systems employing different wireless communication protocols may utilize different antenna structures. These antennas can encounter interference between one another. Some vehicles can require compact integration of wireless communication devices supporting the different wireless protocols such that the amount of space between the wireless antennas is limited. In one non-limiting example, ultra-wideband (UWB) and BLUETOOTH low energy (BLE) antennas may be included in an antenna module in the vehicle that is responsible for authentication and access to a vehicle.

Minimizing the size of antenna module is desirable for various reasons. However, this integration means having less separation between antennas within the module which is causing cross-talking and interference from one antenna to another.

One approach to providing isolation between antennas is air isolation facilitated by free space path loss. For instance, antennas may be standalone components separated by coaxial cable from the printed circuit board (PCB) of the module to provide air-separation and isolation. However, this approach increases the bill of materials, size, and weight of the module. In addition, having a transceiver separated from the antenna, e.g., using coaxial cable, deteriorates performance by adding insertion loss and increasing the variability caused by differences in cable routing.

Another approach to providing the isolation between the antennas is to use bandpass surface acoustic wave (SAW) filters. SAW filters are expensive, they add insertion loss, and can only remove the out-of-band interference, not in-band interference.

As an alternative to air isolation via cabling or the use of SAW filters and as described herein, a PCB spiral resonator, or an array of such resonators may be utilized on the PCB to reduce the coupling between the antennas on the PCB, thereby artificially increasing the air isolation. The resonators may be formed of the same material as the antennas (e.g., copper PCB trace), thereby allowing for fabrication of the resonators with negligible temperature dependency, unlike SAW filters. By using such an approach, an integrated antennas within a small footprint can be utilized.

In one form, the present disclosure provides a vehicle communication device that is configured to transmit and/or receive signals via different wireless communication protocols. More particularly, the vehicle communication device includes a first antenna in accordance with a first communication protocol, a second antenna in accordance with a second communication protocol different from the first communication protocol, and an isolation circuit. The first antenna is configured to emit and detect a first signal and the second antenna is configured to emit and detect a second signal. The isolation circuit is configured to isolate the signals from the first antenna and the second antenna from each other. Specifically, in one form, the isolation circuit includes at least one resonator arranged between the first antenna and the second antenna. The first antenna and the resonator are separated by a first distance along a first axis, and the second antenna and the resonator are separated by a second distance along the first axis, where the first distance is shorter than the second distance. As described herein, the resonator may be provided as a spiral resonator or an array of resonators electrically connected to each other. The resonators are configured to reduce the amount of electric energy from one antenna from interfering with the other antennas, and thus, reduces interference between the antennas. These and other features of the vehicle communication device are described herein.

Referring to FIG. 1, among other systems, a vehicle 100 includes a vehicle activation system (VAS) 102 and a central communication system (CCS) 104, which are configured to transmit and receive data using different types of wireless communication and are collectively referred to as systems 102, 104. The VAS 102 is configured to provide a user with access to the vehicle 100 based on data exchanged via one or more wireless communication links. Specifically, the VAS 102 is configured to authenticate a user and provide access and control of the vehicle 100 to the user based on the authentication.

In one form, the CCS 104 is configured to communicate with devices forming a portion of the vehicle 100 and with external devices. For example, the CCS 104 may communicate with various systems of the vehicle 100, such as, but not limited to: the VAS 102; a body control system (BCS) 106 configured to control various devices making up a body of the vehicle 100 such as windows, passenger seats, and locks; and an Original Equipment Manufacturer (OEM) control module 108 configured to provide information related to the vehicle 100 to the user via an OEM software application and to allow the user to control selected operations within the vehicle 100 via the OEM software application. With respect to external devices, the CCS 104 is configured to communicates with mobile phones, infrastructure systems, and/or other vehicles, among other devices. In one form, the CCS 104 is configured to communicate via different communication networks such as, but not limited to, one or more controller area networks (CANs), near-field communication, BLE communication, local interconnect network (LIN), cellular network, and/or UWB communication. Accordingly, in one form, the CCS 104 is provided as a nexus for establishing communication between external devices and the systems of the vehicle 100. For example, the CCS 104 may receive information from a software application on a mobile phone of the user and transmit the information via CAN to the OEM control module 108. In addition, the OEM control module 108 is configured to transmit information to the CCS 104 via the CAN and the CCS 104 is configured to transmit the information to the OEM software application via a wireless communication link.

In one form, both the VAS 102 and the CCS 104 employ different types of wireless communication links for communication purposes. More particularly, in one form, the VAS 102 and the CCS 104 are configured to communicate via a UWB wireless communication link and a short-frequency range wireless communication link established under, for example, BLE protocol. UWB communication generally has a signal bandwidth that may exceed 500 MHZ. UWB communication is employed for transmitting information across a wide bandwidth, and thus, may be used to transmit pulses that occupy the UWB bandwidth. UWB communication may be used for various applications including, but not limited to, real-time locating application to locate an object/person, and digital key access based on a distance between the vehicle 100 and the computing device of an associated user. In one form, the short-frequency range (SFR) communication, provided via BLE protocol, establishes communication in 2.402 GHz to 2.48 GHZ range for devices that are physically separated by a short distanced, such as, less than or equal to 400 m (i.e., less than or equal to 1,000 ft).

Figure 2:
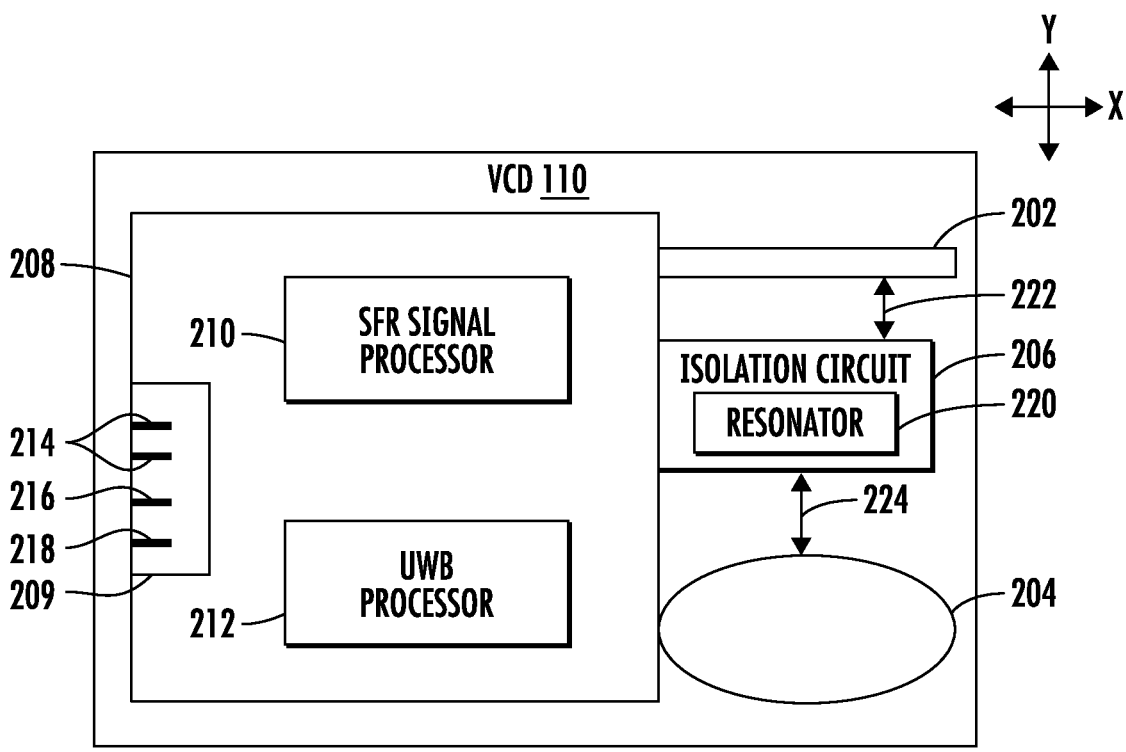
FIG. 2 is a block diagram of the vehicle communication device in accordance with the present disclosure.

Among other electronic components, the systems 102, 104 include a vehicle communication device (VCD) 110 configured to support wireless communication between the systems 102, 104 and other devices. Referring to FIG. 2, in one form, the VCD 110 includes a SFR antenna 202 (i.e., a first antenna), a UWB antenna 204 (i.e., a second antenna), and an isolation circuit 206. The SFR antenna 202 is configured to operate in accordance with a first wireless communication protocol to emit and/or detect one or more signals (i.e., first signals). For example, the SFR antenna 202 is provided as the BLE antenna and emits/detects signals in accordance with the BLE protocol. The UWB antenna 204 is configured to operate in accordance with a UWB communication protocol, different from the first wireless communication protocol, to emit and/or detect one or more signals (i.e., second signals). In some applications, the VCD 110 further includes a processor board 208, an input-output (I/O) interface 209, a SFR signal processor 210 (i.e., a first signal processor), and an UWB processor 212 (i.e., a second signal processor). An I/O interface 209, the SFR signal processor 210, and the UWB processor 212 are provided on the processor board 208. The processor board 208 is further connected to the SFR antenna 202, the UWB antenna 204, and the isolation circuit 206. While specific components are identified, the processor board 208 may include other components, such as but not limited to a power regulator (e.g., a voltage regulator) for adjusting power to components of the processor board 208.

The I/O interface 209 is configured to provide power to the components of the processor board 208 and to communicably couple the SFR signal processor 210 and the UWB processor 212 to a communication module (not shown) of the respective system 102, 104. More particularly, the I/O interface 209 includes a power interface 214, a SFR interface 216 communicably coupled to the SFR signal processor 210, and an UWB interface 218 communicably coupled to the UWB processor 212. In one form, the power interface 214 is configured to electrically couple to a power source to provide electric power to components of the processor board 208.

In one form, the SFR signal processor 210 is electrically coupled to the SFR antenna 202 and is configured to process data to be emitted and/or process signals detected by the SFR antenna 202. For example, the SFR signal processor 210 receives data to be transmitted from the communication module and generates a data pocket in accordance with the SFR communication protocol, and the SFR antenna 202 emits signals indicative of the data pocket. Furthermore, the SFR signal processor 210 processes signals detected by the SFR antenna 202 in accordance with the SFR communication protocol to obtain data to be provided to the communication module. Similarly, the UWB processor 212 is electrically coupled to the UWB antenna 204 and is configured to process data to be emitted and/or process signals detected by the UWB antenna 204 based on the UWB protocol. For example, like the SFR signal processor 210, the UWB processor 212 receives data to be transmitted from the communication module and generates a data pocket in accordance with the UWB protocol and the UWB antenna 204 emits signals indicative of the data pocket. Furthermore, the UWB processor 212 processes signals detected by the UWB antenna 204 in accordance with the UWB protocol to obtain data to be provided to the communication module. Accordingly, the VCD 110 is configured to support wireless communication via SFR communication, like BLE, and/or UWB communication.

In one form, the isolation circuit 206 is configured to isolate the signals associated with the SFR antenna 202 (i.e., first signals) and signals associated with the UWB antenna 204 (i.e., second signals) from each other. More particularly, in one form, the isolation circuit 206 includes at least one resonator 220 arranged between the SFR antenna 202 and the UWB antenna 204, and is connected to the processor board 208 to ground the resonator 220 along with the SFR antenna and the UWB antenna 204. The resonator 220 is configured to oscillate due to electric energy from the antennas 202, 204, thus reducing the amount of electric energy from one of the antennas 202, 204 from interfering with the other antennas 202, 204. By being grounded to the processor board 208, the amount of energy absorbed by the resonator 220 may be improved. In one form, the resonator 220 is made of similar material as the antennas 202, 204, such as copper.

In one form, the isolation circuit 206 having the resonators 220 is positioned to reduce or inhibit influence on the performance of the SFR antenna 202 and/or the UWB antenna 204. The UWB antenna 204 has a higher frequency of operation and thus, having the isolation circuit 206 closer to the UWB antenna 204 may have a stronger effect on the performance of the UWB antenna 204 than on the SFR antenna 202 if the isolation circuit 206 is placed closer to the antenna 202.

The SFR antenna 202, UWB antenna 204, and isolation circuit 206 may be features or traces etched into or otherwise formed onto a PCB of the VCD 110. Thus, the SFR antenna 202, the UWB antenna 204, and the isolation circuit 206 may be described in relation to one another in a two-dimensional plane.

With respect to the two-dimensional plane, which may be defined by a pair of orthogonal axes (e.g., an x-y coordinate system of FIG. 2), the SFR antenna 202 and the resonator 220 are separated by a first distance along a first axis of the two-dimensional plane, and the UWB antenna 204 and the resonator 220 are separated by a second distance along the first axis of the two-dimensional plane. The first distance 222 is generally identified by the arrow between the SFR antenna 202 and the spiral resonator 302, while the second distance 224 is identified by the arrow between the spiral resonator 302 and the UWB antenna 204. In one form, the first distance 222 and the second distance 224 are taken as shortest distance between the resonator 220 and the respective antenna 202, 204. For example, the UWB antenna 204 may have an oval-like shape as illustrated in the figures, and therefore, the second distance 224 may be provided from the resonator 220 to the portion of the antenna 204 closest to the resonator 220. In one form, the first distance 222 is shorter than the second distance 224.

Figure 3A:
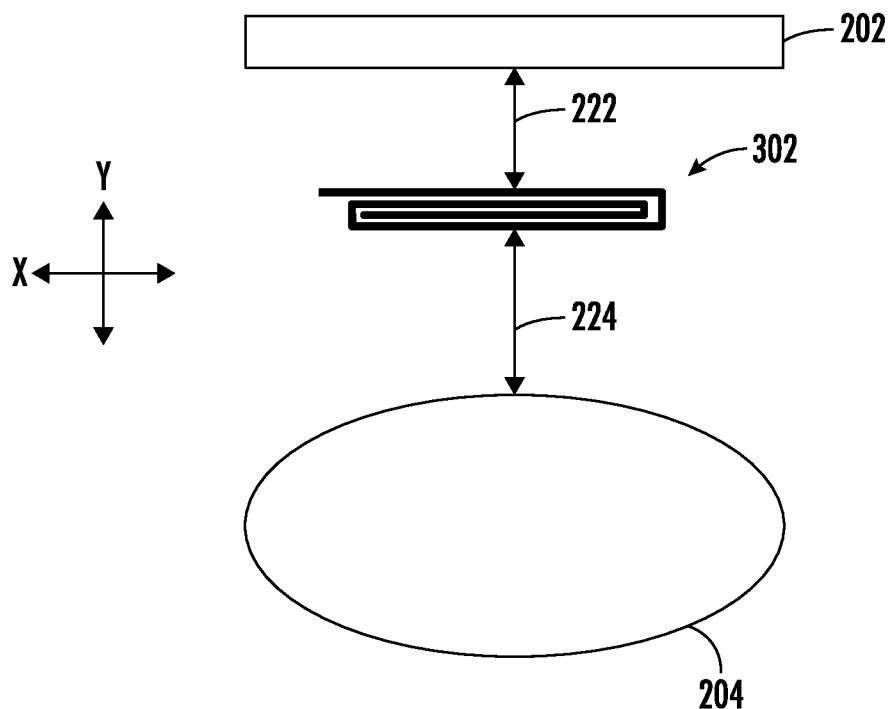
FIG. 3A illustrates a first form of a resonator for an isolation circuit of the vehicle communication device in accordance with the present disclosure.
Figure 3B:
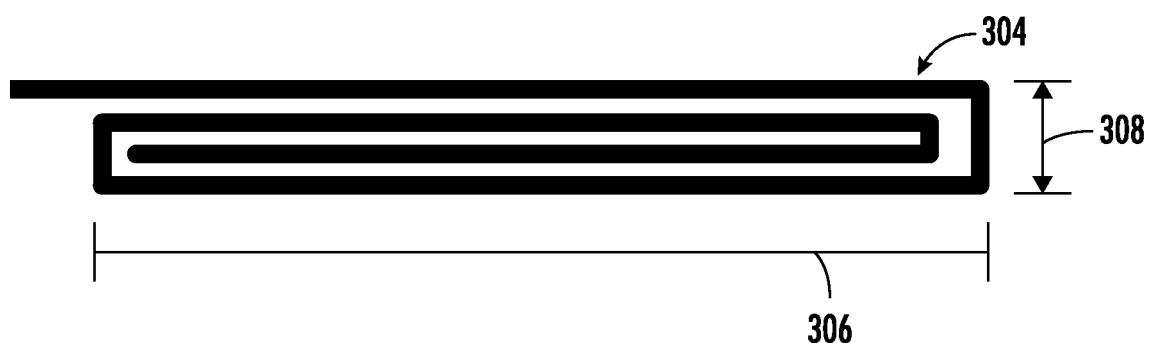
FIG. 3B illustrates a detail of the spiral resonator shown in FIG. 3A.

Referring to FIGS. 3A and 3B, in one form, the at least one resonator 220 includes one spiral resonator 302. The spiral resonator 302 defines a body 304 generally having a body length 306 and a body width 308. In one form, the body length 306 is greater than the first distance 222 and greater than the second distance 224. In some applications, the body length 306 is 6.3 mm and the body width 308 is 1 mm.

In some application, the spiral resonator 302 has an electrical length based on a wavelength of the SFR antenna 202 and more specifically, is substantially half the wavelength of the SFR antenna 202 (i.e., $\lambda_{SFR}/2$). For example, if the SFR antenna 202 is a BLE antenna, the electrical length is 26 mm. In some applications, the SFR antenna 202 may be more susceptible to interference than the UWB antenna 204. Specifically, UWB technology generally has a wide spectrum of frequencies for communication (e.g., each channel 500 MHz), which makes UWB more resistant to jamming and interference compared to SFR technology, like BLE, which has a narrowband communication system (e.g., each channel 2 MHz). Accordingly, the electrical length of the spiral resonator 302 is based on the SFR antenna 202. In one form, the electrical length of the spiral resonator 302 is measured from one end of the spiral resonator 302 to the other end of the spiral resonator 302 following the spiral configuration of the body 304.

In one form, for the spiral resonator 302, the first distance 222 between the spiral resonator 302 and the SFR antenna 202 is 3.2 mm and the second distance 224 between the spiral resonator 302 and the UWB antenna 204 is 5 mm.

Figure 4A:
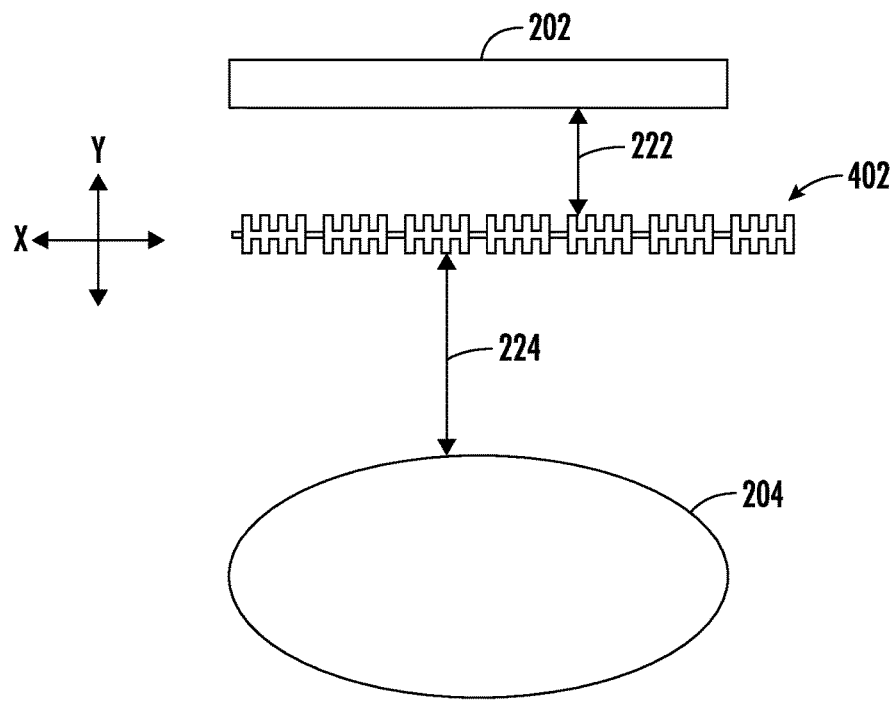
FIG. 4A illustrates a second form of a resonator for the isolation circuit of the vehicle communication device in accordance with the present disclosure.
Figure 4B:
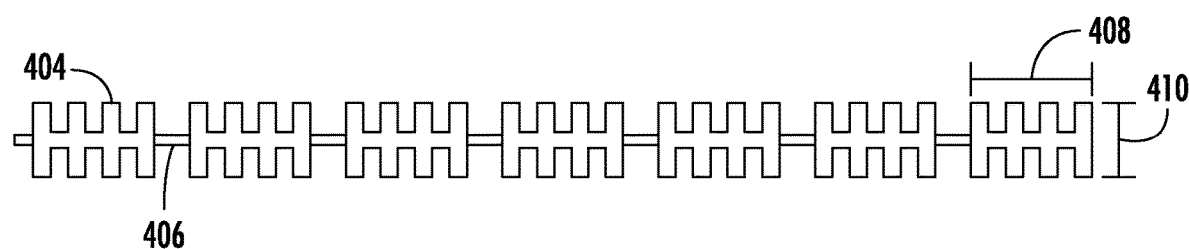
FIG. 4B illustrates a detail of the second form of resonator shown in FIG. 4A.

Referring to FIGS. 4A and 4B, in one form, the at least one resonator 220 includes an array of resonators connected to each other, and are collectively referred to as a resonator array 402. In one form, the resonator array 402 includes a plurality of resonators 404 connected in series with an electrical connector 406 electrically connecting two resonators 404. The electrical connector 406 has a length less than a length of a single resonator 404. For example, the length 408 of the electrical connector 406 is 0.4 mm, and a length 401 of each resonator is 2.2 mm and a width is 1.8 mm. Accordingly, with seven resonators 404, the overall length of the resonator array 402 is approximately 17.8 mm. Each resonator 404 among the resonator array 402 has same length 408 and same width 410. For the resonator array 402, the first distance 222 between the resonator array 402 and the SFR antenna 202 is 3.1 mm and the second distance 224 between the resonator array 402 and the UWB antenna is 4.1 mm.

While seven resonators 404 are illustrated, the resonator array 402 may include two or more resonators, and should not be limited to seven.

In some applications and in accordance with the present disclosure, the shape of the resonators 404, the dimensions of each resonator 404, and the dimensions of the resonator array 402 are adapted to provide desired isolation between the antennas 202, 204 without affecting performance of each of the antennas 202, 204.

The VCD 110 of the present disclosure employs the isolation circuit 206 to reduce coupling between the SFR antenna 202 and the UWB antenna 204 via the resonator 220. The isolation circuit 206 may be provided at the same processor board 208 as the antennas 202, 204 to reduce complexity of the VCD 110. As provided above, the isolation circuit 206 inhibits or reduces electric coupling and thus, reduces interference between the antennas 202, 204. In one form, the single spiral resonator 302 may be employed as the resonator 220 if a specific frequency is to be isolated. On the other hand, if there are multiple frequencies to be isolated, the resonator array 402 may be employed as the resonator 220. This is because the array can provide greater isolation across a larger frequency range as compared to a single spiral resonator, which may instead provide better performance for a specific frequency of interest with smaller bandwidth.

Thus, by using a spiral resonator or a resonator array, in-band isolation can be increased for smaller modules with shorter antenna separations. This method may accordingly enhance the antenna module performance, reduce expense, weight, and complexity. Such a design may also be easily fabricated on the same PCB layer of an integrated antenna.

Unless otherwise expressly indicated herein, all numerical values indicating dimensions and/or tolerances, or other characteristics are to be understood as modified by the word "about" or "approximately" in describing the scope of the present disclosure. This modification is desired for various reasons including, but not limited to, operational characteristics of VCD, industrial practice, manufacturing, and assembly tolerances, and testing capability.

In this application, the term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

As used herein, the phrase at least one of A, B, and C should be construed to mean a logical (A OR B OR C), using a non-exclusive logical OR, and should not be construed to mean "at least one of A, at least one of B, and at least one of C."

While exemplary embodiments are described above, it is not intended that these embodiments describe all possible forms of the present disclosure. Rather, the words used in the specification are words of description rather than limitation, and it is understood that various changes may be made without departing from the spirit and scope of the present disclosure. Additionally, the features of various implementing embodiments may be combined to form further embodiments of the present disclosure.

What is claimed is:

1. A vehicle communication device comprising:
a first antenna configured to operate, in accordance with a first wireless communication protocol, to emit and detect at least one first signal;
a second antenna configured to operate, in accordance with a second wireless communication protocol different from the first wireless communication protocol, to emit and detect at least one second signal; and
an isolation circuit configured to isolate the at least one first signal and the at least one second signal from each other, the isolation circuit including at least one resonator, arranged between the first antenna and the second antenna with respect to a two-dimensional plane, wherein:
the first antenna and the at least one resonator are separated by a first distance along a first axis of the two-dimensional plane,
the second antenna and the at least one resonator are separated by a second distance along the first axis of the two-dimensional plane,
the first distance is shorter than the second distance; and
wherein the at least one resonator includes one spiral resonator.

2. The vehicle communication device of claim 1, wherein the first antenna provides BLUETOOTH communication and the second antenna provides ultra-wideband (UWB) communication.

3. The vehicle communication device of claim 1, wherein:
the one spiral resonator defines a body having a body length and a body width that is less than the body length, and
the body length is greater than both the first and second distances.

4. The vehicle communication device of claim 3, wherein the body length is 6.3 mm and the body width is 1 mm.

5. The vehicle communication device of claim 4, wherein the one spiral resonator has an electrical length based on a wavelength of the first antenna.

6. The vehicle communication device of claim 4, wherein the first distance between the one spiral resonator and the first antenna is 3.2 mm and the second distance between the one spiral resonator and the second antenna is 5 mm.

7. The vehicle communication device of claim 1 further comprising a processor board including:
a first signal processor electrically coupled to the first antenna and configured to process the at least one first signal to be emitted or to be detected via the first antenna, and
a second signal processor electrically coupled to the second antenna and configured to process the at least one second signal to be emitted or to be detected via the second antenna.

8. A vehicle communication device comprising:
a first antenna configured to operate, in accordance with a first wireless communication protocol, to emit and detect at least one first signal;
a second antenna configured to operate, in accordance with a second wireless communication protocol different from the first wireless communication protocol, to emit and detect at least one second signal; and
an isolation circuit configured to isolate the at least one first signal and the at least one second signal from each other, the isolation circuit including at least one resonator, arranged between the first antenna and the second antenna with respect to a two-dimensional plane, wherein:
- the first antenna and the at least one resonator are separated by a first distance along a first axis of the two-dimensional plane,
- the second antenna and the at least one resonator are separated by a second distance along the first axis of the two-dimensional plane,
- the first distance is shorter than the second distance; and
- wherein the at least one resonator includes an array of resonators connected to each other.

9. The vehicle communication device of claim 8, wherein the array of resonators includes a plurality of resonators connected in series with an electrical connector electrically connecting two resonators, wherein the electrical connector has a length less than a length of a single resonator.

10. The vehicle communication device of claim 9, wherein the length of the electrical connector is 0.4 mm.

11. The vehicle communication device of claim 8 wherein each resonator among the array of resonators has same length and same width.

12. The vehicle communication device of claim 8, wherein the first distance between the array of resonators and the first antenna is 3.1 mm and the second distance between the array of resonators and the second antenna is 4.1 mm.

13. A vehicle communication device comprising:
- a first antenna configured to emit and detect at least one first signal;
- an ultra-wideband (UWB) antenna, as a second antenna, configured to emit and detect at least one second signal;
- an isolation circuit configured to isolate the at least one first signal and the at least one second signal from each other, the isolation circuit including at least one resonator arranged between the first antenna and the second antenna; and
- a processor board including:
  - a first signal processor electrically coupled to the first antenna and configured to process the at least one first signal to be emitted or to be detected via the first antenna, and
  - a second signal processor electrically coupled to the second antenna and configured to process the at least one second signal to be emitted or to be detected via the second antenna, wherein:
- a first distance is defined between the first antenna and the at least one resonator,
- a second distance is defined between the second antenna and the at least one resonator,
- the first distance is shorter than the second distance; and
- wherein the at least one resonator includes one spiral resonator.

14. The vehicle communication device claim 13, wherein the first distance between the one spiral resonator and the first antenna is 3.2 mm and the second distance between the one spiral resonator and the second antenna is 5 mm.

15. A vehicle communication device comprising:
- a first antenna configured to emit and detect at least one first signal;
- an ultra-wideband (UWB) antenna, as a second antenna, configured to emit and detect at least one second signal;
- an isolation circuit configured to isolate the at least one first signal and the at least one second signal from each other, the isolation circuit including at least one resonator arranged between the first antenna and the second antenna; and
- a processor board including:
  - a first signal processor electrically coupled to the first antenna and configured to process the at least one first signal to be emitted or to be detected via the first antenna, and
  - a second signal processor electrically coupled to the second antenna and configured to process the at least one second signal to be emitted or to be detected via the second antenna, wherein:
- a first distance is defined between the first antenna and the at least one resonator,
- a second distance is defined between the second antenna and the at least one resonator,
- the first distance is shorter than the second distance; and
- wherein the at least one resonator includes an array of resonators connected to each other.

16. The vehicle communication device of claim 15, wherein the array of resonators includes a plurality of resonators connected in series with an electrical connector electrically connecting two resonators, wherein the electrical connector has a length less than a length of a single resonator.

17. The vehicle communication device of claim 15 wherein each resonator among the array of resonators has same length and same width.

18. The vehicle communication device of claim 15, wherein the first distance between the array of resonators and the first antenna is 3.1 mm and the second distance between the array of resonators and the second antenna is 4.1 mm.

* * * * *